United States Patent
Zayer et al.

(10) Patent No.: US 11,652,332 B2
(45) Date of Patent: May 16, 2023

(54) DUAL OUTPUT LASER DIODE

(71) Applicant: II-VI Delaware, Inc, Wilmington, DE (US)

(72) Inventors: Nadhum Kadhum Zayer, Devon (GB); Abram Jakubowicz, Pfaeffikon SZ (CH); Jean Axel Edmond Teissier, Huningue (FR); Susanne Pawlik, Zürich (CH)

(73) Assignee: II-VI DELAWARE, INC, Wilmington, DE (US)

( * ) Notice: Subject to any disclaimer, the term of this patent is extended or adjusted under 35 U.S.C. 154(b) by 286 days.

(21) Appl. No.: 16/947,643

(22) Filed: Aug. 11, 2020

(65) Prior Publication Data

US 2022/0052510 A1 Feb. 17, 2022

(51) Int. Cl.
*H01S 5/10* (2021.01)
*H01S 5/026* (2006.01)
*H01S 5/042* (2006.01)
*H01S 3/067* (2006.01)
*H01S 3/094* (2006.01)
*H01S 3/0941* (2006.01)

(52) U.S. Cl.
CPC .......... *H01S 5/1096* (2013.01); *H01S 3/0675* (2013.01); *H01S 3/06758* (2013.01); *H01S 3/0941* (2013.01); *H01S 3/094003* (2013.01); *H01S 3/094061* (2013.01); *H01S 5/026* (2013.01); *H01S 5/042* (2013.01)

(58) Field of Classification Search
None
See application file for complete search history.

(56) References Cited

U.S. PATENT DOCUMENTS

| | | | |
|---|---|---|---|
| 5,224,116 A * | 6/1993 | Whitley | H01S 3/094003 372/71 |
| 9,503,181 B2 | 11/2016 | McClean et al. | |
| 9,590,390 B1 * | 3/2017 | Tatah | G11B 5/314 |
| 10,320,151 B1 * | 6/2019 | Traverso | H01S 5/1203 |
| 2005/0243882 A1 * | 11/2005 | He | H01S 5/026 372/50.1 |
| 2006/0239321 A1 * | 10/2006 | Kume | G11B 7/1275 372/50.122 |
| 2015/0333472 A1 * | 11/2015 | Demir | H01S 5/0233 372/27 |

FOREIGN PATENT DOCUMENTS

WO WO-03084006 A2 * 10/2003 ............ H01S 5/146

OTHER PUBLICATIONS

Communication Components, 980nm Pump Lasers—Dual Chip, website: <https://optical.communications.ii-vi.com/node/4723> II-VI Incorporated, retrieved Aug. 13, 2020.

* cited by examiner

*Primary Examiner* — Eric L Bolda
(74) *Attorney, Agent, or Firm* — Blank Rome LLP

(57) ABSTRACT

A dual output laser diode may include first and second end facets and an active section. The first and second end facets have low reflectivity. The active section is positioned between the first end facet and the second end facet. The active section is configured to generate light that propagates toward each of the first and second end facets. The first end facet is configured to transmit a majority of the light that reaches the first end facet through the first end facet. The second end facet is configured to transmit a majority of the light that reaches the second end facet through the second end facet.

17 Claims, 3 Drawing Sheets

DUAL OUTPUT LASER DIODE

FIELD

The embodiments discussed herein relate to a dual output laser diode.

BACKGROUND

Unless otherwise indicated in the present disclosure, the materials described in the present disclosure are not prior art to the claims in the present application and are not admitted to be prior art by inclusion in this section.

Doped fiber amplifiers generally operate by energizing ions in a doped fiber with pump light from a pump laser diode. An optical signal at a different wavelength than the pump light is transmitted through the doped fiber. Photons of the optical signal interact with the energized ions, causing the ions to give up some of their energy in the form of photons at the same wavelength as the photons of the optical signal, with the ions returning to a lower energy state. The optical signal is thereby amplified as it passes through the doped fiber.

The subject matter claimed in the present disclosure is not limited to implementations that solve any disadvantages or that operate only in environments such as those described above. Rather, this background is only provided to illustrate one example technology area where some implementations described in the present disclosure may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In an example, a dual output laser diode may include first and second end facets and an active section. The first end facet has low reflectivity. The second end facet has low reflectivity. The active section is positioned between the first end facet and the second end facet. The active section is configured to generate light that propagates toward each of the first and second end facets. The first end facet is configured to transmit a majority of the light that reaches the first end facet through the first end facet. The second end facet is configured to transmit a majority of the light that reaches the second end facet through the second end facet.

In another example, a dual fiber amplifier system may include first and second fiber amplifiers and a dual output laser diode. The first fiber amplifier includes a first pump input optical fiber. The second fiber amplifier includes a second pump input optical fiber. The dual output laser diode includes first and second end facets and an active section. The first end facet has low reflectivity and is optically coupled to the first pump input optical fiber. The second end facet has low reflectivity and is positioned opposite the first end facet and optically coupled to the second pump input optical fiber. The active section is positioned between the first end facet and the second end facet. The active section is configured to generate pump light in response to injection of an electrical drive signal into the active section. The pump light is configured to propagate toward each of the first and second end facets. The first end facet is configured to transmit a portion of the pump light that reaches the first end facet through the first end facet. The first pump input optical fiber is positioned to receive the portion of the pump light that passes through the first end facet. The second end facet is configured to transmit a portion of the pump light that reaches the second end facet through the second end facet. The second pump input optical fiber is positioned to receive the portion of the pump light that passes through the second end facet.

In another example, a method may include injecting an electrical drive signal into an active section of a dual output laser diode. The active section may be positioned between a first end facet and a second end facet of the dual output laser diode. The method may include generating light in the active section of the dual output laser diode responsive to injection of the electrical drive signal. The method may include propagating the light toward each of the first and second end facets. The method may include transmitting a majority of the light that reaches the first end facet through the first end facet. The method may include transmitting a majority of the light that reaches the second end facet through the second end facet.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Figure 1A:
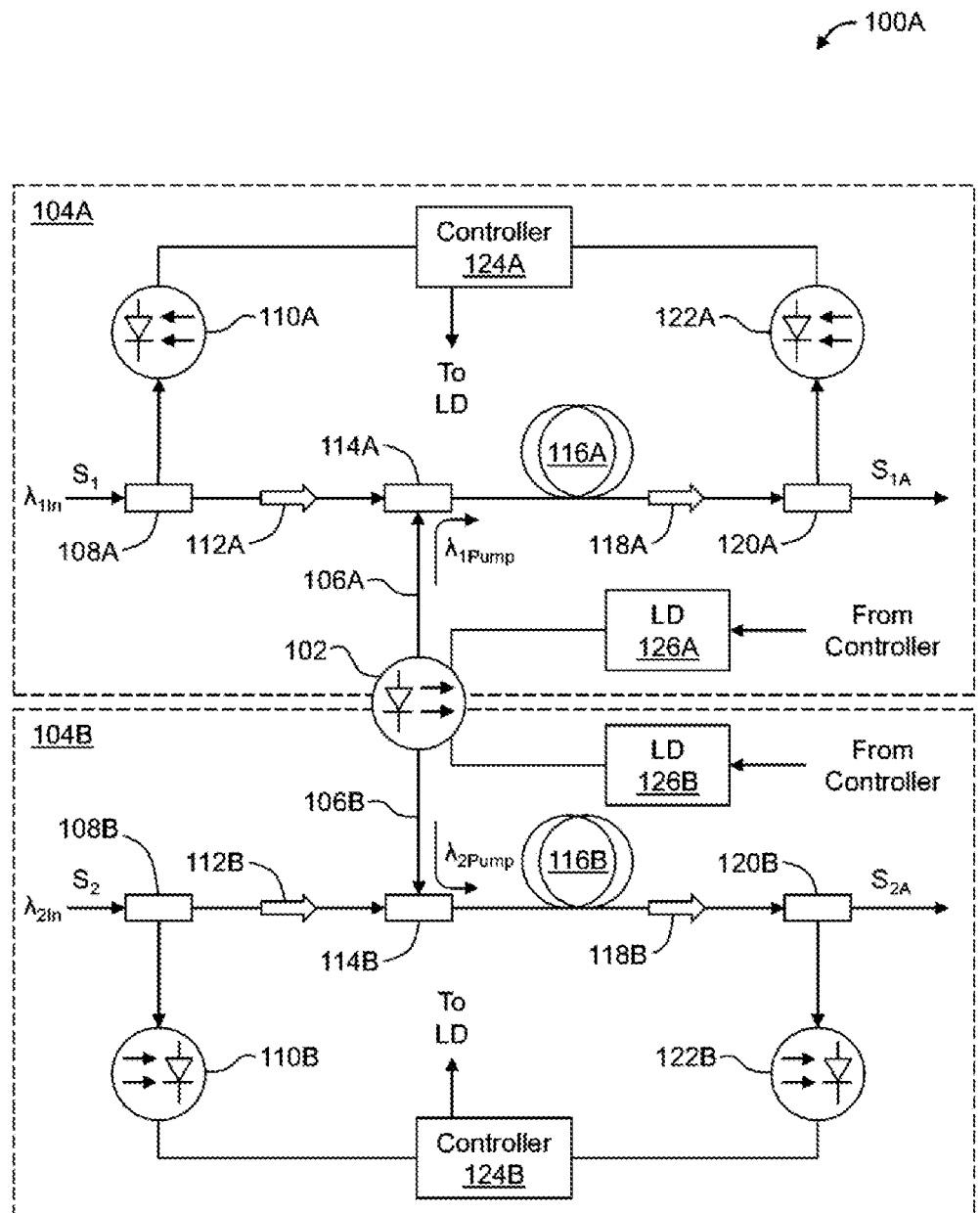
FIG. 1A illustrates an example dual fiber amplifier system that includes a dual output laser diode.

Embodiments described herein relate to a dual output laser diode that generally includes an active section positioned between two end facets, each of which has low reflectivity. For example, each of the end facets may have an anti-reflection (AR) coating. In comparison, other laser diodes typically include an AR coating on only one end facet with a high reflectivity (HR) coating on the other end facet to direct substantially all light generated in the laser diode through the end facet with the AR coating.

Example dual output laser diodes described herein may be implemented with fiber amplifier systems such as erbium-doped fiber amplifier (EDFA) systems or other systems. Some fiber amplifier systems pump multiple doped fibers with pump light from a single laser diode. In particular, the pump light may be split into multiple paths using one or more optical components external to the laser diode. Splitting the pump light externally to the laser diode may result in pump instability due to coherent interactions and other effects.

According to embodiments described herein, the pump light is effectively split internally in the laser diode, e.g., by configuring each end facet with a low reflectivity such that some pump light exits each end facet and may be directed into a corresponding path. This arrangement may avoid or at least reduce pump instability due to coherent interactions and other effects that may arise when the pump light is output from one end facet of the laser diode and is split externally to the laser diode.

In addition, this arrangement may decrease a maximum optical power density within the laser diode by a factor of about two since no pump light or relatively little pump light is reflected at one end facet back to the other as occurs in, e.g., laser diodes with an AR coating at one end facet and an HR coating at the other. The reduced maximum optical power density of laser diodes according to embodiments described herein relative to laser diodes with AR and HR coatings at opposite end facets may increase reliability.

In an embodiment, the dual output laser diode may output equal or about equal pump light power from the end facets.

In an embodiment, the dual output laser diode may output unequal pump light power from the end facets. Unequal pump light power may be achieved with AR coatings of unequal reflectivity at the end facets, such as a first AR coating with a reflectivity of 1% at a first end facet and a second AR coating with a reflectivity of 0.75% at a second end facet. Alternatively or additionally, unequal pump light power at the end facets may be achieved by structuring a waveguide of the laser diode to have different transmissivities at or near the two end facets, such as a transmissivity of 99.5% for a portion of the waveguide near the first end facet and a transmissivity of 99% for a portion of the waveguide near the second end facet.

Alternatively or additionally, unequal pump light power at the end facets may be achieved by independently controlling first and second portions of the dual output laser diode. In this and other embodiments, the dual output laser diode may include a first anode and cathode electrically coupled to the first portion of the laser diode and a second anode and cathode electrically coupled to the second portion of the laser diode. An etched mirror, a distributed feedback (DFB) mirror, or other reflective structure may be formed in the laser diode between the first and second portions to optically isolate the first and second portions from each other. Accordingly, the first portion of the laser diode and the second portion of the laser diode may be independently operated while being integrally formed in a single structure.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

FIG. 1A illustrates an example dual fiber amplifier system 100A (hereinafter "system 100A") that includes a dual output laser diode 102 (hereinafter "laser 102"), arranged in accordance with at least one embodiment described herein. The system 100A may further include first and second fiber amplifiers 104A, 104B (collectively "fiber amplifiers 104" or generically "fiber amplifier 104"). The fiber amplifiers 104 include respective pump paths 106A, 106B (collectively "pump paths 106" or generically "pump path 106") that may include optical fibers or other suitable waveguides to convey pump light from the laser 102 into the corresponding one of the fiber amplifiers 104. When implemented as optical fibers, the pump paths 106 may be referred to as pump input optical fibers.

In general, the laser 102 may include two end facets and may be configured to output pump light from each of the two end facets into a corresponding one of pump paths 106. For example, a portion, e.g., some or most, of the pump light that reaches each end facet may be transmitted through the end facet and a corresponding pump input optical fiber of the pump paths 106 may be positioned to receive the portion of the pump light that passes through the corresponding end facet. Configuring the laser 102 to output pump light from both end facets may eliminate the need for any components external to the laser 102 to split pump light as required for laser diodes that have a HR coating at one end facet with pump light output only from the other end facet.

Each fiber amplifier 104 may include an input optical tap 108A, 108B (hereinafter collectively "input taps 108" or generically "input tap 108"), an input photodiode 110A, 110B (hereinafter collectively "input photodiodes 110" or generically "input photodiode 110"), a first optical isolator 112A, 112B (hereinafter collectively "first isolators 112" or generically "first isolator 112"), a beam combiner 114A, 114B (hereinafter collectively "combiners 114" or generically "combiner 114"), a doped fiber 116A, 116B (hereinafter collectively "doped fibers 116" or generically "doped fiber 116"), a second optical isolator 118A, 118B (hereinafter collectively "second isolators 118" or generically "second isolator 118"), an output optical tap 120A, 120B (hereinafter collectively "output taps 120" or generically "output tap 120"), and an output photodiode 122A, 122B (hereinafter collectively "output photodiodes 122" or generically "output photodiode 122"). In general, each fiber amplifier 104 is configured to receive an optical signal $S_1$ or $S_2$ as input and to output an amplified signal $S_{1A}$ or $S_{2A}$ which is an amplified version of the optical signal $S_1$ or $S_2$ respectively.

In more detail, the optical signal $S_1$ or $S_2$ is received at the input tap 108 and a small portion thereof (e.g., 2%) is directed by the input tap 108 to the input photodiode 110 to, e.g., measure optical power of the optical signal $S_1$ or $S_2$. A remainder (e.g., 98%) of each of the optical signals $S_1$ or $S_2$ passes through the input tap 108 and the first isolator 112 to the combiner 114. The first isolator 112 may be configured to prevent or at least reduce back reflection from the combiner 114. The combiner 114 combines the optical signal $S_1$ or $S_2$ with the pump light received from the laser 102 via the pump path 106.

Each optical signal $S_1$ or $S_2$ has a wavelength $\lambda_{1In}$ or $\lambda_{2In}$. The values of $\lambda_{1In}$ and $\lambda_{2In}$ may be the same or different. The pump light received at the combiner 114 has a wavelength $\lambda_{1Pump}$ or $\lambda_{2Pump}$. The values of $\lambda_{1Pump}$ and $\lambda_{2Pump}$ may be the same or different. Further, the values of $\lambda_{1Pump}$ and $\lambda_{2Pump}$ are selected to provide optical amplification to the corresponding optical signal $S_1$ or $S_2$ operating at $\lambda_{1In}$ or $\lambda_{2In}$ in the presence of a specific rare-earth dopant within the doped fiber 116. The dopant may be erbium, ytterbium, or other dopant. When the dopant is erbium, the wavelength $\lambda_{1Pump}$ or $\lambda_{2Pump}$ of the pump light emitted by the laser 102 may be about 980 nanometers (nm) (e.g., 970 nm to 990 nm), such as a wavelength of 972 nm, 974 nm, 976 nm, or 978 nm. In some embodiments, pump light at the wavelengths $\lambda_{1Pump}$ or $\lambda_{2Pump}$ of about 980 nanometers may be configured to provide amplification in the doped fiber 116 to the optical signals $S_1$ or $S_2$ when the wavelengths $\lambda_{1In}$ or $\lambda_{2In}$ of the optical signals $S_1$ and $S_2$ are about 1550 nm, such as wavelengths in the C band (~1535 nm to 1565 nm), or about 1590 nm, such as wavelengths in the L band (~1565 nm to 1625 nm).

The combiner 114 outputs the optical signal $S_1$ or $S_2$ combined with the pump light to the doped fiber 116. The pump light at wavelength $\lambda_{1Pump}$ or $\lambda_{2Pump}$ energizes ions in the doped fiber 116 and the optical signal $S_1$ or $S_2$ at wavelength $\lambda_{1In}$ or $\lambda_{2In}$ interacts with the energized ions. In particular, photons of the optical signal $S_1$ or $S_2$ at the wavelength $\lambda_{1In}$ or $\lambda_{2In}$ stimulate emission of photons from the energized ions at the wavelength $\lambda_{1In}$ or $\lambda_{2In}$ to generate the amplified signal $S_{1A}$ or $S_{2A}$.

The amplified signal $S_{1A}$ or $S_{2A}$ passes through the second isolator 118 to the output tap 120. The output tap 120 directs a small portion of the amplified signal $S_{1A}$ or $S_{2A}$ to the output photodiode to, e.g., measure optical power of the amplified signal $S_{1A}$ or $S_{2A}$. The remainder of the amplified signal $S_{1A}$ or $S_{2A}$ passes through the output tap 120 and is output from the fiber amplifier 104.

The system 100A may additionally include one or more controllers 124A, 124B (hereinafter collectively "controllers 124" or generically "controller 124") and one or more laser drivers 126A, 126B (hereinafter collectively "laser drivers 126" or generically "laser driver 126") ("LD" in FIG. 1A). The controller 124 may be communicatively coupled to the input photodiode 110 and the output photodiode 122. The laser driver 126 may be communicatively coupled to the controller 124 and the laser 102. The laser driver 126 is generally configured to apply an electrical drive signal to the laser 102 as directed by the controller 124. Optical power of the pump light emitted by the laser 102 may be determined by the electrical drive signal. For example, the laser 102 may emit pump light with an optical power that is proportional to or has some other known relationship to current of the electrical drive signal.

The controller 124 may compare the optical power of the optical signal $S_1$ or $S_2$, e.g., as measured by the input photodiode 110, to the optical power of the amplified signal $S_{1A}$ or $S_{2A}$, e.g., as measured by the output photodiode 122, to determine gain of the fiber amplifier 104. If the gain is above or below a target gain, the laser driver 126 may adjust the electrical drive signal to increase or decrease the gain of the fiber amplifier 104. In some embodiments described herein, the laser 102 includes two portions that may be independently controlled by a corresponding one of the laser drivers 126 to independently control gain in the fiber amplifiers 104.

FIG. 1A illustrates an example in which the optical power of the pump light from the two end facets of the laser 102 is independently controlled, e.g., by providing independent electrical drive signals from independent laser drivers 126 to independent portions of the laser 102. In other embodiments, the optical power of the pump light from the two end facets may not be independent from the other. In these and other embodiments, the system 100A may have a single controller 124 and a single laser driver 126 rather than two controllers 124 and two laser drivers 126.

Figure 1B:
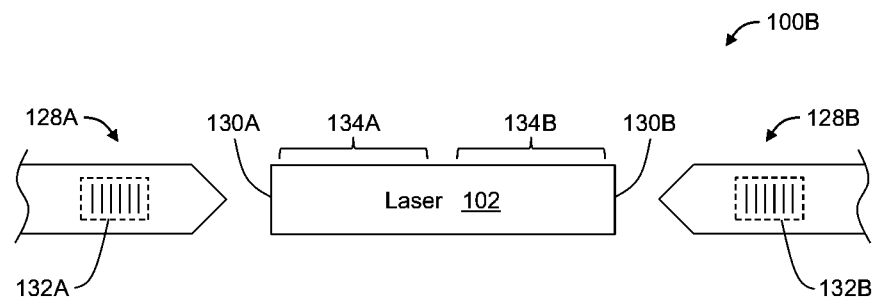
FIG. 1B illustrates a portion of the dual fiber amplifier system of FIG. 1A that includes the dual output laser diode and first and second pump input optical fibers.

FIG. 1B illustrates a portion 100B of the system 100A of FIG. 1A that includes the laser 102 and first and second pump input optical fibers 128A, 128B (hereinafter collectively "pump input optical fibers 128" or generically "pump input optical fiber 128"), arranged in accordance with at least one embodiment described herein. The pump input optical fibers 128 may include, be included in, or correspond to the pump paths 106 of FIG. 1A.

As illustrated in FIG. 1B, the laser 102 includes two end facets 130A, 130B (hereinafter collectively "end facets 130" or generically "end facet 130") spaced apart from each other. Each of the end facets 130 has low reflectivity, such as a reflectivity of 5%, 3%, or 1% or less. The reflectivity may include reflectivity for a single wavelength, multiple wavelengths, or across a range of wavelengths such as an operational wavelength range of the laser 102. The operational wavelength range may include wavelengths suitable for pump light, such as wavelengths of about 980 nm or other wavelengths. In some embodiments, the operational wavelength range may be from 970 nm to 990 nm, or from 975 nm to 985 nm, or other suitable range.

The pump input optical fibers 128 are positioned so that the corresponding end facet 130 is optically coupled to the corresponding pump input optical fiber 128. For example, the first end facet 130A is optically coupled to the first pump input optical fiber 128A and the second end facet 130B is optically coupled to the second pump input optical fiber 128B. In some embodiments, each pump input optical fiber 128 may be optically aligned to the corresponding end facet 130 and positioned sufficiently close to the corresponding end facet 130 that pump light output from the first end facet 130A is coupled into the pump input optical fiber 128. Alternatively or additionally, one or more optical elements, such as one or more lenses or other optical elements, may be positioned between the end facet 130 and the pump input optical fiber 128.

Each of the pump input optical fibers 128 may include a first or second fiber Bragg grating (FBG) 132A, 132B (hereinafter collectively "FBGs 132" or generically "FBG 132") formed therein. The FBGs 132 may be configured to reflect a portion, e.g., 2-4%, of the pump light back to the laser 102. Each FBG 132 may be configured to reflect back a predetermined wavelength or multiple predetermined wavelengths which may "lock" the laser 102 to the predetermined wavelength(s) such that the laser 102 exhibits stable lasing at the predetermined wavelength(s). The FBGs 132 may be configured to reflect back the same or different predetermined wavelength(s), to cause the laser 102 to emit pump light from the end facets 130 at the same or different predetermined wavelength(s).

For example, the first FBG 132A may be configured to reflect back a first wavelength of 974 nm. The reflected light may be coupled through the first end facet 130A into the laser 102 where it interacts generally with a first portion 134A of the laser 102 such that the first portion 134A of the laser 102 is locked to 974 nm.

The second FBG 132B may be configured to reflect back both the first wavelength of 974 nm and a second wavelength of 976 nm. The reflected light may be coupled through the second end facet 130B into the laser 102 where it interacts generally with a second portion 134B of the laser 102 such that the second portion 134B of the laser 102 is locked to both 974 nm and 976 nm.

More generally, each FBG 132 may lock the corresponding first or second portion 134A, 134B of the laser 102 to one or multiple predetermined wavelength(s).

In other embodiments, the laser 102 itself may include a DFB structure to lock the laser 102 to a predetermined wavelength(s) such that the FBGs 132 may be omitted.

In some embodiments, each of the FBGs 132 forms a fiber cavity with the laser 102, the FBGs 132 providing sufficient reflectivity to ensure lasing of the laser 102. Alternatively or additionally, the laser 102 may include a ridge structure as described with respect to FIG. 2. Roughness of the ridge structure, thermal induced refractive changes, or gain induced refractive changes along the length of the laser 102 may reflect and scatter light generated in the laser 102 sufficiently to build up the optical field and ensure lasing of the laser 102. In some embodiments, the laser 102 may have a higher threshold or gain for lasing than other lasers in view of the low reflectivity at the end facets 130.

Figure 2:
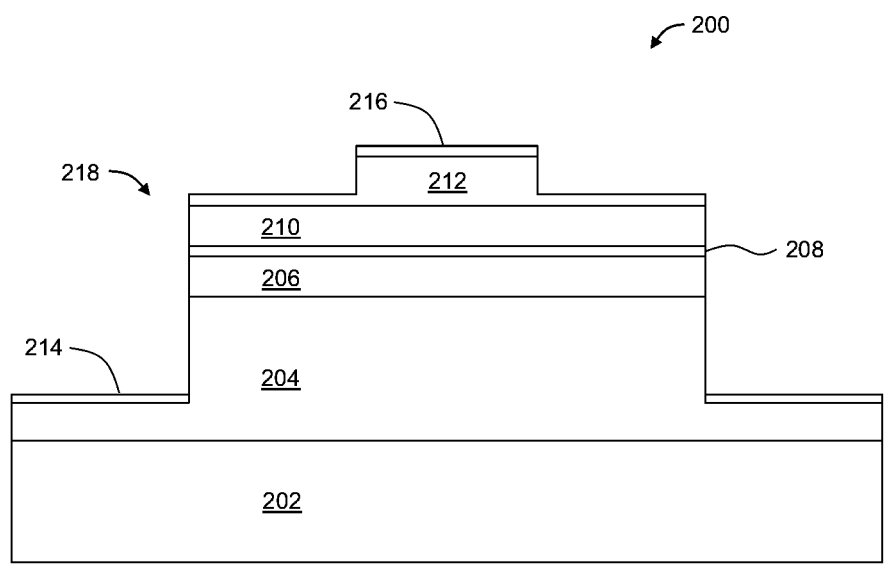
FIG. 2 is a cross-sectional view of an example dual output laser diode.

FIG. 2 is a cross-sectional view of an example dual output laser diode 200 (hereinafter "laser 200"), arranged in accordance with at least one embodiment described herein. The laser 200 may include, be included in, or correspond to the other lasers herein. The cross-sectional view of FIG. 2 is in a plane that is parallel to end facets of the laser 200 and perpendicular to a light emission direction of the laser 200. The light emission direction is in and out of the page in FIG. 2 and this direction is also referred to as a longitudinal direction.

As illustrated in FIG. 2, the laser 200 and laser diodes generally may include various epitaxial layers, such as a substrate 202, a lower cladding layer 204, a lower waveguide layer 206, an active layer 208, an upper waveguide layer 210, an upper cladding layer 212, a cathode 214, and an anode 216. The laser 200 may include additional or different layers or elements than illustrated in FIG. 2 in other embodiments. The end facets of the laser 200 may be formed in the epitaxial layers, e.g., by cleaving through the epitaxial layers.

The configuration of FIG. 2 includes the active layer 208 with multiple quantum wells (MQWs) embedded in the lower and upper waveguide layers 206, 210 and surrounded by lower and upper cladding layers 204, 212 that are configured to confine the optical mode in a transversal direction, e.g., vertically in FIG. 2.

The laser 200 includes a ridge structure 218 to confine the optical mode in a lateral direction, e.g., horizontally in FIG. 2. The ridge structure 218 with lower and upper waveguide layers 206, 210 and lower and upper cladding layers 204, 212 forms a waveguide that extends longitudinally, e.g., in and out of the page in FIG. 2, between end facets of the laser 200 and that is configured to guide light generated by the laser 200.

The active layer 208 may extend longitudinally for all or a portion of a length (e.g., in and out of the page in FIG. 2) of the laser 200. Alternatively or additionally, the anode 216 may extend longitudinally for all or a portion of the length of the laser 200 and the anode 216 may have a region in which current is injected, referred to as a current injection region, that may extend longitudinally for all or a portion of a length of the anode 216. A length of the current injection region may determine a longitudinal extent of stimulated emission of light within the laser 200. A portion of the laser 200 that extends longitudinally the length of the active layer 208, the length of the anode 216, or the length of the current injection region of the anode 216 may be referred to as an active section of the laser 200. The active section of the laser 200 may, but does not necessarily, extend longitudinally from one end facet to the other.

The cathode 214 and the anode 216 are electrically coupled to opposite sides of the active section. In the example of FIG. 2, the cathode 214 and the anode 216 are electrically coupled in particular to a bottom and top of the active section of the laser 200. A laser driver, such as the laser driver 126 of FIG. 1A, may be coupled to the anode 216 to inject an electrical drive signal into and through the laser 200 to the cathode 214. The electrical drive signal may cause electrons and holes to be injected from opposite sides into the active layer 208 where they recombine via stimulated emission to generate photons.

Figure 3:
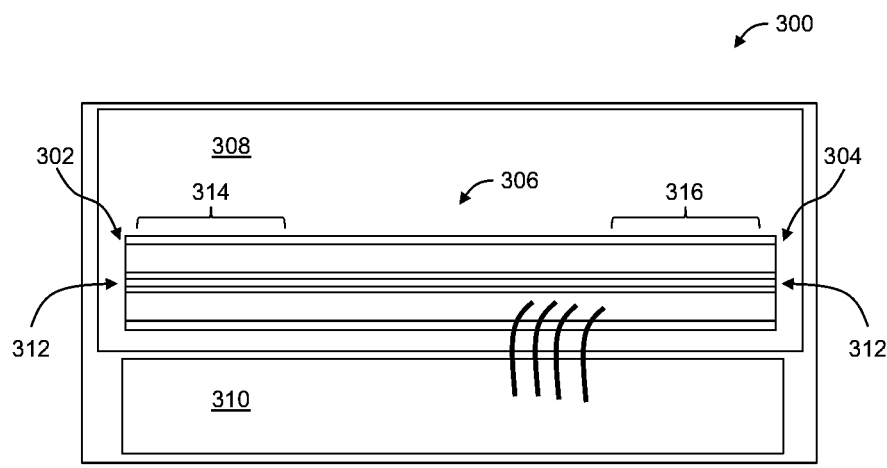
FIG. 3 is a top view of another example dual output laser diode.

FIG. 3 is a top view of another example dual output laser diode 300 (hereinafter "laser 300"), arranged in accordance with at least one embodiment described herein. The laser 300 may include, be included in, or correspond to the other lasers herein. As illustrated in FIG. 3, the laser 300 may include a first end facet 302, a second end facet 304, and an active section 306 positioned between the first end facet 302 and the second end facet 304.

In general, the active section 306 may be configured to generate light that propagates toward each of the first and second end facets 302, 304. The light may be generated by the active section 306 in response to injection of an electrical drive signal into the active section 306. The laser 300 may further include an anode 308 and a cathode 310 electrically coupled to opposite sides, e.g., a top and bottom, of the active section 306 to inject the electrical drive signal into the active section 306 between the anode 308 and the cathode 310.

Each of the first and second end facets 302, 304 may have low reflectivity. In an example, the low reflectivity at each of the first and second end facets 302, 304 is achieved by cleaving the laser 300 from a wafer of lasers and forming an AR coating on the cleaved end facets.

In these and other embodiments, the first and second end facets 302, 304 may be configured to transmit a portion, such as a majority, of the light generated by the active section 306 that reaches the first or second end facet 302, 304 through the first or second end facet 302, 304. For example, the first or second end facet 302, 304 may be configured to transmit at least 95%, 97%, or 99% of the light generated by the active section 306 that reaches the first or second end facet 302, 304 through the first or second end facet 302, 304. In these and other embodiments, the first or second end facet 302, 304 may have a reflectivity less than 1%. The reflectivity may be or include reflectivity for a single wavelength, multiple wavelengths, or a range of wavelengths such as an operational wavelength range of the laser 300. The operational wavelength range of the laser 300 may be the same as or different than other operational wavelength ranges described herein.

In some embodiments, the reflectivity of the first end facet 302 is the same as the reflectivity of the second end facet 304. Accordingly, the optical power of light output from the first and second end facets 302, 304 may be the same or approximately the same.

In some embodiments, the reflectivity of the first end facet 302 is different than the reflectivity of the second end facet 304. Accordingly, the optical power of light output from the first end facet 302 may be different than the optical power of light output from the second end facet 304.

The active section 306 may include a waveguide 312 that extends between the first end facet 302 and the second end facet 304. The waveguide 312 may include the waveguide described with respect to FIG. 2 or other suitable waveguide. A first portion 314 of the waveguide 312 near the first end facet 302 may have a first transmissivity. A second portion 316 of the waveguide 312 near the second end facet 304 may have a second transmissivity. The first and second transmissivities may each be or include transmissivity for a single wavelength, multiple wavelengths, or a range of wavelengths such as the operational wavelength range of the laser 300. In these and other embodiments, the first and second transmissivities may be greater than 95%, 97%, or 99%.

The first and second transmissivities of the first and second portions 314, 316 of the waveguide 312 may be the same or different. The first and second transmissivities may depend on materials and structure of the first and second portions 314, 316 of the waveguide 312. Accordingly, the materials or structure of the first and second portions 314, 316 of the waveguide 312 may be selected to output light with equal or different optical power from the first and second end facets 302, 304, as desired.

Figure 4:
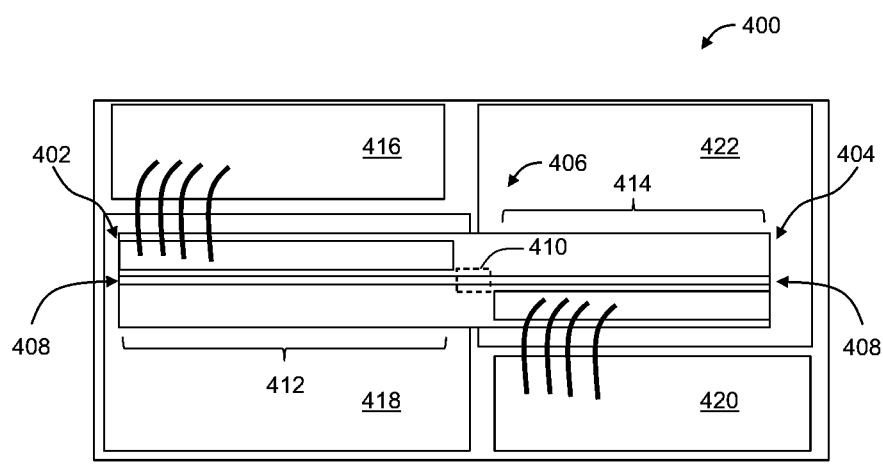
FIG. 4 is a top view of another example dual output laser diode, all arranged in accordance with at least one embodiment described herein.

FIG. 4 is a top view of another example dual output laser diode 400 (hereinafter "laser 300"), arranged in accordance with at least one embodiment described herein. The laser 400 may include, be included in, or correspond to the other lasers herein. As illustrated in FIG. 4, the laser 400 may include a first end facet 402, a second end facet 404, and an active section 406 positioned between the first end facet 402 and the second end facet 404. The laser 400 may additionally include a waveguide 408. The first and second end facets 402, 404, the active section 406, and the waveguide 408 may generally be configured and operated in the same or similar manner as the corresponding components in other lasers described herein.

The laser 400 may additionally include a reflective structure 410 formed in the active section 406 between first and second portions 412, 414 of the active section 406. The reflective structure 410 may be configured to optically isolate the first portion 412 of the active section 406 from the second portion 414 of the active section 406. The reflective structure 410 may include an etched mirror, a DFB structure, or other suitable structure formed in the active section 406. When implemented as a DFB structure, the reflective structure 410 may lock the laser 400 to a predetermined wavelength(s).

A placement of the reflective structure 410 within the active section 406 may be selected to divide the active section 406 into portions of equal or unequal length. For example, as illustrated in FIG. 4, the first portion 412 is longer than the second portion 414. In general, greater active section length leads to greater optical power output, all other parameters being equal. Accordingly, another option to provide unequal optical power at the end facets of a dual output laser diode, if desired, is to configure the dual output laser diode with an active section with two portions of unequal length as illustrated in FIG. 4.

The laser 400 may further include a first anode and cathode 416, 418 electrically coupled to the first portion 412 of the active section 406 and a second anode and cathode 420, 422 electrically coupled to the second portion 414 of the active section 406. In particular, the first anode and cathode 416, 418 may be electrically coupled to opposite sides (e.g., top and bottom) of the first portion 412 of the active section 406 and the second anode and cathode 420, 422 may be electrically coupled to opposite sides (e.g., top and bottom) of the second portion 414 of the active section 406. A first electrical drive signal may be injected through the first portion 412 via the first anode and cathode 416, 418 and a second electrical drive signal may be injected through the second portion 414 via the second anode and cathode 420, 422. Accordingly, while the first and second portions 412, 414 of the active section 406 are integrally formed in a single structure (e.g., an epitaxial structure of the laser 400), they may nevertheless be independently operated.

An example method to operate a dual output laser diode or a dual fiber amplifier system will now be described. The dual output laser diode may include any of the lasers 102, 200, 300, 400 or other lasers described herein. The dual fiber amplifier system may include the system 100A or other dual fiber amplifier systems described herein.

The method may include injecting an electrical drive signal into an active section of a dual output laser diode, the active section positioned between a first end facet and a second end facet of the dual output laser diode. Injecting the electrical drive signal into the active section may include injecting a single electrical drive signal into the active section, e.g., via the anode 216, 310 and cathode 214, 308 of FIGS. 2-3.

Alternatively or additionally, injecting the electrical drive signal into the active section may include injecting a first electrical drive signal into a first portion of the active section, e.g., the first portion 412 of FIG. 4 via the first anode and cathode 416, 418, and injecting a second electrical drive signal into a second portion of the active section, e.g., the second portion 414 of FIG. 4 via the second anode and cathode 420, 422. The first portion of the active section may be optically isolated from the second portion of the active section, e.g., by a reflective structure such as the reflective structure 410 of FIG. 4.

The method may include generating light in the active section of the dual output laser diode responsive to injection of the electrical drive signal.

The method may include propagating the light toward each of the first and second end facets. In particular, some of the generated light may be propagated toward the first end facet and some of the generated light may be propagated toward the second end facet.

The method may include transmitting a majority of the light that reaches the first end facet through the first end facet. Transmitting the majority of the light that reaches the first end facet through the first end facet may include transmitting at least 99% of the light that reaches the first end facet through the first end facet.

The method may include transmitting a majority of the light that reaches the second end facet through the second end facet. Transmitting the majority of light that reaches the second end facet through the second end facet may include transmitting at least 99% of the light that reaches the second end facet through the second end facet.

In some embodiments, the method may also include coupling light transmitted through the first end facet into a first pump input optical fiber of a first fiber amplifier and coupling light transmitted through the second end facet into a second pump input optical fiber of a second fiber amplifier. The method may further include operating each of the first and second fiber amplifiers, e.g., as described with respect to FIG. 1A.

Unless specific arrangements described herein are mutually exclusive with one another, the various implementations described herein can be combined in whole or in part to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A dual output laser diode, comprising:
   a first end facet that has low reflectivity;
   a second end facet that has low reflectivity; and
   an active section positioned between the first end facet and the second end facet,
   wherein:
      the active section is configured to generate light that propagates toward each of the first and second end facets;
      the first end facet is configured to transmit a majority of the light that reaches the first end facet through the first end facet; and
      the second end facet is configured to transmit a majority of the light that reaches the second end facet through the second end facet, and
   wherein:
      the active section comprises a waveguide that extends between the first end facet and the second end facet;
      a first portion of the waveguide near the first end facet has a first transmissivity across an operational wavelength range;
      a second portion of the waveguide near the second end facet has a second transmissivity across the operational wavelength range; and
      the first transmissivity of the first portion of the waveguide is different than the second transmissivity of the second portion of the waveguide.

2. The dual output laser diode of claim 1, wherein a reflectivity of each of the first end facet and the second end facet is less than 1%.

3. The dual output laser diode of claim 1, wherein a reflectivity of the first end facet is the same as a reflectivity of the second end facet.

4. The dual output laser diode of claim 1, wherein a reflectivity of the first end facet is different than a reflectivity of the second end facet.

5. A dual output laser diode comprising:
   a first end facet that has low reflectivity;
   a second end facet that has low reflectivity;
   an active section positioned between the first end facet and the second end facet and
   a reflective structure formed in the active section between a first portion of the active section and a second portion of the active section, the reflective structure configured to optically isolate the first portion of the active section from the second portion of the active section,
   wherein:
      the active section is configured to generate light that propagates toward each of the first and second end facets;
      the first end facet is configured to transmit a majority of the light that reaches the first end facet through the first end facet; and
      the second end facet is configured to transmit a majority of the light that reaches the second end facet through the second end facet.

6. The dual output laser diode of claim 5, wherein the reflective structure formed in the active section comprises an etched mirror or a distributed feedback (DFB) structure.

7. A dual fiber amplifier system, comprising:
   a first fiber amplifier that includes a first pump input optical fiber;
   a second fiber amplifier that includes a second pump input optical fiber; and
   a dual output laser diode that includes:
      a first end facet that has low reflectivity, the first end facet optically coupled to the first pump input optical fiber;
      a second end facet that has low reflectivity, the second end facet positioned opposite the first end facet and optically coupled to the second pump input optical fiber; and
      an active section positioned between the first end facet and the second end facet, wherein:
      the active section is configured to generate pump light in response to injection of an electrical drive signal into the active section, the pump light configured to propagate toward each of the first and second end facets;
      the first end facet is configured to transmit a portion of the pump light that reaches the first end facet through the first end facet;
      the first pump input optical fiber is positioned to receive the portion of the pump light that passes through the first end facet;
      the second end facet is configured to transmit a portion of the pump light that reaches the second end facet through the second end facet; and
      the second pump input optical fiber is positioned to receive the portion of the pump light that passes through the second end facet, and
   wherein:
      the first pump input optical fiber includes a first fiber Bragg grating (FBG) configured to lock pump light received through the first end facet to a first wavelength; and
      the second pump input optical fiber includes a second FBG configured to lock pump light received through the second end facet to a second wavelength.

8. The dual fiber amplifier system of claim 7, wherein the first wavelength is different than the second wavelength.

9. The dual fiber amplifier system of claim 7, wherein a reflectivity of each of the first end facet and the second end facet is less than 1%.

10. The dual fiber amplifier system of claim 7, wherein a reflectivity of the first end facet is the same as a reflectivity of the second end facet.

11. The dual fiber amplifier system of claim 7, wherein a reflectivity of the first end facet is different than a reflectivity of the second end facet.

12. A dual fiber amplifier system comprising:
a first fiber amplifier that includes a first pump input optical fiber;
a second fiber amplifier that includes a second pump input optical fiber; and
a dual output laser diode that includes:
a first end facet that has low reflectivity, the first end facet optically coupled to the first pump input optical fiber;
a second end facet that has low reflectivity, the second end facet positioned opposite the first end facet and optically coupled to the second pump input optical fiber; and
an active section positioned between the first end facet and the second end facet, wherein:
the active section is configured to generate pump light in response to injection of an electrical drive signal into the active section, the pump light configured to propagate toward each of the first and second end facets;
the first end facet is configured to transmit a portion of the pump light that reaches the first end facet through the first end facet;
the first pump input optical fiber is positioned to receive the portion of the pump light that passes through the first end facet;
the second end facet is configured to transmit a portion of the pump light that reaches the second end facet through the second end facet; and
the second pump input optical fiber is positioned to receive the portion of the pump light that passes through the second end facet, and
wherein at least one of the first pump input optical fiber or the second pump input optical fiber includes a fiber Bragg grating (FBG) configured to lock pump light received from the dual output laser diode to at least two wavelengths.

13. A dual fiber amplifier system comprising:
a first fiber amplifier that includes a first pump input optical fiber;
a second fiber amplifier that includes a second pump input optical fiber; and
a dual output laser diode that includes:
a first end facet that has low reflectivity, the first end facet optically coupled to the first pump input optical fiber;
a second end facet that has low reflectivity, the second end facet positioned opposite the first end facet and optically coupled to the second pump input optical fiber; and
an active section positioned between the first end facet and the second end facet, wherein:
the active section is configured to generate pump light in response to injection of an electrical drive signal into the active section, the pump light configured to propagate toward each of the first and second end facets;
the first end facet is configured to transmit a portion of the pump light that reaches the first end facet through the first end facet;
the first pump input optical fiber is positioned to receive the portion of the pump light that passes through the first end facet;
the second end facet is configured to transmit a portion of the pump light that reaches the second end facet through the second end facet; and
the second pump input optical fiber is positioned to receive the portion of the pump light that passes through the second end facet, and
wherein:
the active section comprises a waveguide that extends between the first end facet and the second end facet;
a first portion of the waveguide near the first end facet has a first transmissivity;
a second portion of the waveguide near the second end facet has a second transmissivity; and
the first transmissivity of the first portion of the waveguide is different than the second transmissivity of the second portion of the waveguide.

14. A dual fiber amplifier system comprising:
a first fiber amplifier that includes a first pump input optical fiber;
a second fiber amplifier that includes a second pump input optical fiber;
a dual output laser diode that includes:
a first end facet that has low reflectivity, the first end facet optically coupled to the first pump input optical fiber;
a second end facet that has low reflectivity, the second end facet positioned opposite the first end facet and optically coupled to the second pump input optical fiber; and
an active section positioned between the first end facet and the second end facet, wherein:
the active section is configured to generate pump light in response to injection of an electrical drive signal into the active section, the pump light configured to propagate toward each of the first and second end facets;
the first end facet is configured to transmit a portion of the pump light that reaches the first end facet through the first end facet;
the first pump input optical fiber is positioned to receive the portion of the pump light that passes through the first end facet;
the second end facet is configured to transmit a portion of the pump light that reaches the second end facet through the second end facet; and
the second pump input optical fiber is positioned to receive the portion of the pump light that passes through the second end facet; and
a reflective structure formed in the active section between a first portion of the active section and a second portion of the active section, the reflective structure configured to optically isolate the first portion of the active section from the second portion of the active section.

15. A method, comprising:
injecting an electrical drive signal into an active section of a dual output laser diode, the active section positioned between a first end facet and a second end facet of the dual output laser diode;

generating light in the active section of the dual output laser diode responsive to injection of the electrical drive signal;
propagating the light toward each of the first and second end facets;
transmitting a majority of the light that reaches the first end facet through the first end facet; and
transmitting a majority of the light that reaches the second end facet through the second end facet,
wherein injecting the electrical drive signal into the active section comprises injecting a first electrical drive signal into a first portion of the active section and injecting a second electrical drive signal into a second portion of the active section, the first portion of the active section optically isolated from the second portion of the active section.

16. The method of claim 15, further comprising:
coupling light transmitted through the first end facet into a first pump input optical fiber of a first fiber amplifier; and
coupling light transmitted through the second end facet into a second pump input optical fiber of a second fiber amplifier.

17. The method of claim 15, wherein:
transmitting the majority of the light that reaches the first end facet through the first end facet comprises transmitting at least 99% of the light that reaches the first end facet through the first end facet; and
transmitting the majority of light that reaches the second end facet through the second end facet comprises transmitting at least 99% of the light that reaches the second end facet through the second end facet.

* * * * *